United States Patent
Shao et al.

(10) Patent No.: US 8,009,719 B2
(45) Date of Patent: Aug. 30, 2011

(54) DIGITAL SPREAD SPECTRUM METHOD BASED ON PRECISE PHASE DELTA-SIGMA ALGORITHM

(75) Inventors: Zhuyan Shao, Shanghai (CN); Juan Qiao, Shanghai (CN); Qichang Wu, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 1005 days.

(21) Appl. No.: 11/904,895

(22) Filed: Sep. 28, 2007

(65) Prior Publication Data

US 2009/0086875 A1 Apr. 2, 2009

(51) Int. Cl.
*H04B 1/69* (2006.01)
(52) U.S. Cl. .................................................... 375/130
(58) Field of Classification Search .......... 375/130, 375/139, 247, 376; 708/250–252
See application file for complete search history.

(56) References Cited

U.S. PATENT DOCUMENTS

| 7,406,144 | B2 * | 7/2008 | Wang | 375/376 |
| 7,639,053 | B2 * | 12/2009 | Shen et al. | 327/158 |
| 2005/0077935 | A1 * | 4/2005 | Giuroiu | 327/156 |
| 2008/0074154 | A1 * | 3/2008 | Shin | 327/105 |
| 2008/0201597 | A1 * | 8/2008 | Chong et al. | 713/401 |

* cited by examiner

*Primary Examiner* — Young T. Tse
(74) *Attorney, Agent, or Firm* — Haynes and Boone LLP

(57) ABSTRACT

A method and apparatus for generating a spread spectrum reference clock is presented. A method and apparatus is presented for receiving a spread spectrum parameter from a phase lock loop, wherein the spread spectrum parameter includes a multiple-level parameter comprising a plurality of phase signals; quantizing a spread spectrum profile associated with the spread spectrum parameter; mapping the quantized profile; generating control signals based on the mapping, wherein the control signals include an integer control signal and a phase control signal; dividing a phase signal of the plurality of phase signals with the integer control signal; synchronizing the divided phase signal using the phase control signal; and providing a reference clock for a spread spectrum clock generator based on the synchronizing.

17 Claims, 12 Drawing Sheets

US 8,009,719 B2

DIGITAL SPREAD SPECTRUM METHOD BASED ON PRECISE PHASE DELTA-SIGMA ALGORITHM

FIELD

The embodiments of the present invention generally relate to a circuit for generating the spread spectrum reference/feedback clock for a phase-locked loop (PLL) in a Spread Spectrum Clock Generator (SSCG).

BACKGROUND

Spread spectrum technology is a cost effective method to reduce Electromagnetic Interference (EMI) in the PC motherboard. Effectively shaping noise, delta-sigma ($\Delta$-$\Sigma$) technology is adopted by most digital spread spectrum implementations in SSCG. At higher spectrum amplitudes, the SSCG performs well. However, when reducing the spectrum amplitude, its performance can become increasingly worse.

For traditional implementations, to improve the performance of the SSCG, a higher resolution of $\Delta$-$\Sigma$ is needed. For example, an output source providing a higher timing accuracy can improve the performance. Increasing the operation frequency is a known option, but it can be limited by the maximum allowed operation frequency and power consumption of the device.

For spread spectrum solutions based on a PLL, a frequency divider can be used for generating the source timing. Using an integer-N counter with known solutions, the resolution of the divider is inversely proportional to the frequency of the input clock (e.g., higher resolution can be obtained by a higher work frequency) if the frequency of the output clock is fixed. For the traditional $\Delta$-$\Sigma$ application, the minimum step of the divisors is 2 because the closest two divisors must be N+1 and N−1 (2=N+1−(N−1)). Because of this large minimum step, the resolution of the output spread clock is affected, thereby providing a less accurate output spread clock.

SUMMARY

In accordance with some embodiments of the present invention, a method and apparatus for generating a spread spectrum reference clock is presented. A method according to some embodiments of the invention can include receiving a spread spectrum parameter from a phase lock loop, wherein the spread spectrum parameter includes a multiple-level parameter comprising a plurality of phase signals; quantizing a spread spectrum profile associated with the spread spectrum parameter; mapping the quantized profile; generating control signals based on the mapping, wherein the control signals include an integer control signal and a phase control signal; dividing a phase signal of the plurality of phase signals with the integer control signal; synchronizing the divided phase signal using the phase control signal; and providing a reference clock for a spread spectrum clock generator based on the synchronizing.

A system according to some embodiments of the present invention can include a phase locked loop providing a spread spectrum parameter including a multiple-level parameter comprising a plurality of phase signals; and a phase spread spectrum controller that receives the spread spectrum parameter. The phase spread spectrum controller can include a phase mapper configured to map a quantized spread spectrum profile associated with the spread spectrum parameter, a phase controller configured to generate control signals based on the map profile, wherein the control signals includes an integer control signal and a phase control signal, an integer divider configured to divide a phase signal of the plurality of phase signals with the integer control signal, and a phase synchronizer configured to synchronize the divided phase signal using the phase control signal to generate a reference clock for a spread spectrum clock generator.

In some embodiments, an apparatus can include a phase mapper configured to map a quantized spread spectrum profile associated with a spread spectrum parameter from a phase locked loop, wherein the spread spectrum parameter includes a multiple-level parameter comprising a plurality of phase signals; a phase controller configured to generate control signals based on the map profile, wherein the control signals includes an integer control signal and a phase control signal, an integer divider configured to divide a phase signal of the plurality of phase signals with the integer control signal, and a phase synchronizer configured to synchronize the divided phase signal using the phase control signal to generate a reference clock for a spread spectrum clock generator.

These and other embodiments are further described below with respect to the following figures.

DETAILED DESCRIPTION OF THE EMBODIMENTS

Reference will now be made in detail to the exemplary embodiments implemented according to the invention, the examples of which are illustrated in the accompanying drawings. Wherever possible, the same reference numbers will be used throughout the drawings to refer to the same or like parts.

The embodiments of the invention are illustrated in this disclosure based on a remapping of a $\Delta$-$\Sigma$ quantization result and a two-stage post phase synchronization technique. In some embodiments, a phase selection technique is used for performance improvement. In some embodiments of the invention, the resolution of the Fraction N counter can be improved by 2*K time compared with the traditional art at a same operation frequency, where K is the number of levels of source PLL's Voltage Controlled Oscillator(VCO) (e.g., K=3,5,7,9,11, . . . ). Further, for solutions regarding the spread spectrum in the feedback path, the source PLL is the spread-PLL itself. For a spread spectrum in the reference path, the source PLL is the PLL that generates the input clock for the frequency divider.

Further, the resolution of the output code from a Δ-Σ modulator can be doubled by the quantization result remapping technique. The value of the two closest prescalers can be programmed to swing from N to N+1 (or N to N−1) for a minimum swing step of 1, instead of the traditional implementations having only a minimum swing step of 2. An offset value of +½ or −½ can be introduced when implementing this remapping technique.

With the implementation of the post phase synchronization technique, the timing accuracy of an output spread clock can be further improved by K times. For some embodiments of the invention, the clock output from the source PLL's VCO is first divided by an integer pre-loadable counter (e.g., the N-bit pre-load counter of FIG. 8) at some determined phase. The clock output from the divider is then transferred to a phase synchronization circuit, which extends the design timing margin from T/K to T/2. This reduces the design difficulty and enlarges the process window. With the post phase synchronization scheme, in some embodiments, only two high frequency flip flops are needed. This allows the ability to increase the resolution of the SSCG with only a small increment to the silicon area and power consumption.

Figure 1A:
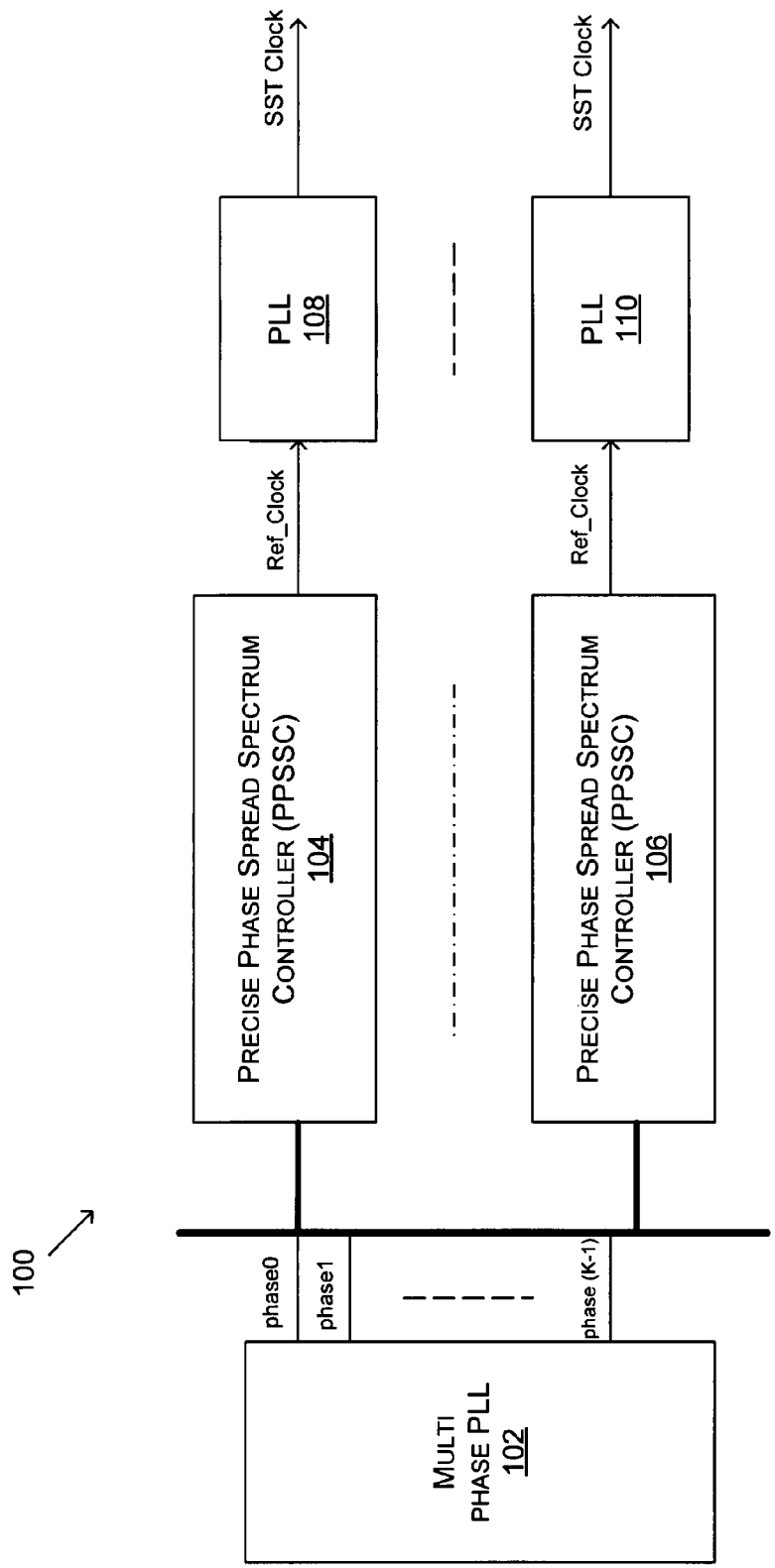
FIGS. 1A-B illustrate block diagrams of exemplary systems of a digital spread spectrum timing circuit according to some embodiments of the present invention.

FIG. 1A illustrates a block diagram of an exemplary system including a digital spread spectrum timing circuit according to some embodiments of the invention. Exemplary system 100 provides spread-spectrum timing based on the K-level of phase signals (phase0 to phase(K−1)) outputted by the multiphase PLL 102. Exemplary system 100 can include, among other things, a multi-phase PLL 102, one or more PPSSCs 104, 106, and multiple PLLs 108, 110.

Multi-phase PLL 102 provides the phase signals (phase0 to phase(K−1)) of the spreadable exemplary system 100 to the one or more PPSSCs 104, 106. While multi-phase PPL 102 is illustrated, any component can be used that provides phase signals of a spreadable PLL. For example, multi-phase PLL 102 could be similar to a common, well-known PLL illustrated in FIG. 2.

Figure 2:
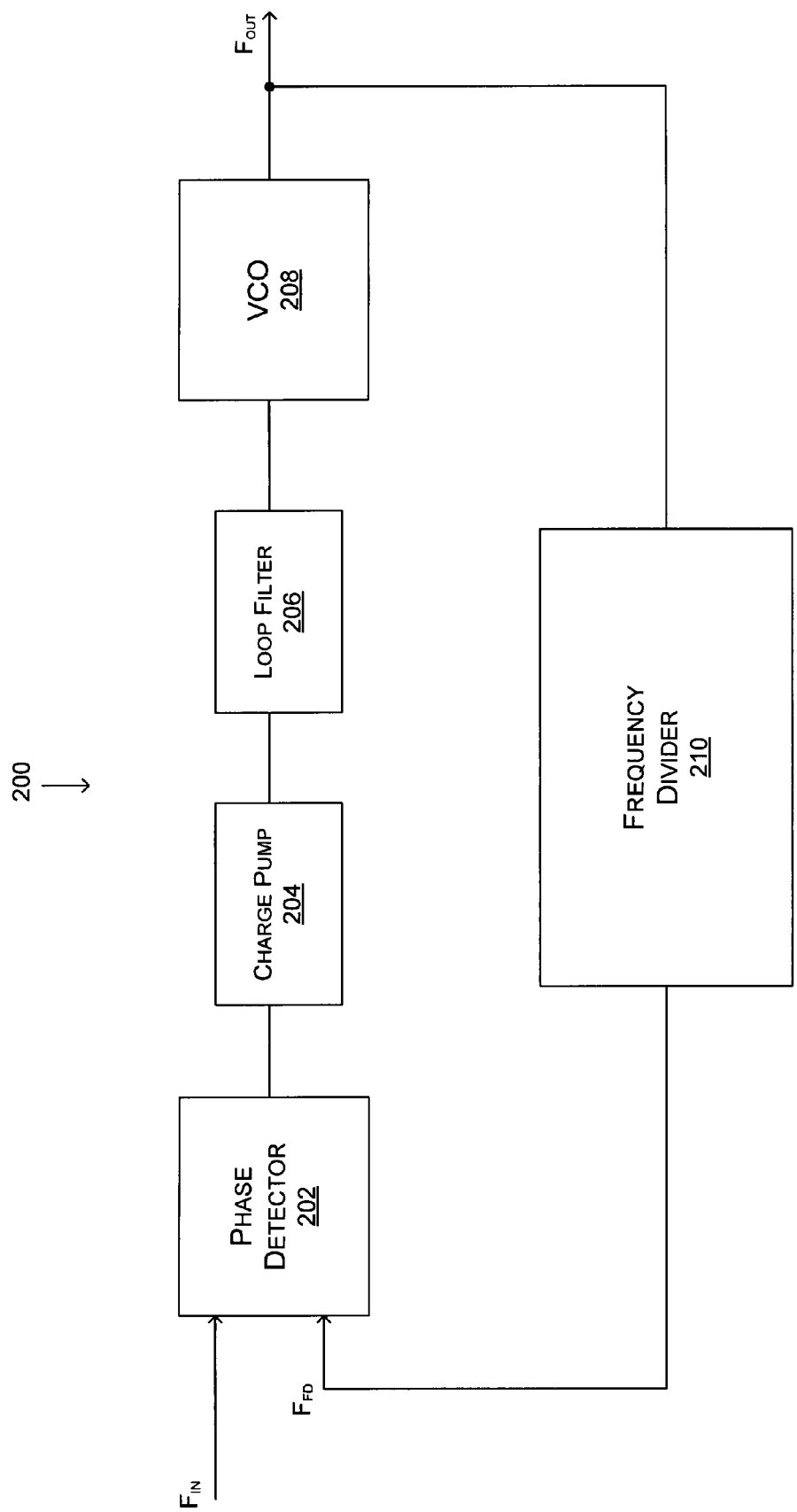
FIG. 2 illustrates a block diagram of a typical PLL system.

FIG. 2 illustrates an example of PLL 200. PLL 200 comprises a phase detector 202, a charge pump 204, a loop filter 206, a voltage-controlled oscillator (VCO) 208, and a frequency divider 210.

Generally, phase detector 202 compares a reference input signal, $F_{IN}$, to a feedback signal, $F_{FD}$, from frequency divider 210. In some embodiments, $F_{IN}$ may be adjusted according to frequency divider 210. Depending on the phase difference between $F_{IN}$ and $F_{FD}$, phase detector 202 drives charge pump 204. The output of charge pump 204 is filtered by loop filter 206, and is used to drive VCO 208. VCO 208 receives an input voltage from loop filter 206 and outputs a signal, $F_{OUT}$, with a frequency proportional to the input. In some embodiments, VCO 208 can output $F_{OUT}$ in a K number of levels, for example, as illustrated by phase0 to phase(K−1) in FIGS. 1A & 1B. VCO 208 feeds $F_{OUT}$ back through frequency divider 210 to phase detector 202. Frequency divider 210 divides the frequency of signal $F_{OUT}$ to match $F_{IN}$ for comparison purposes.

The frequency at which PLL 200 operates can depend on the frequency of VCO 208 and the amount of division by the frequency divider 210. To change the frequency of $F_{OUT}$, these elements can be adjusted. Typically, the frequency at the input of frequency divider 210, $F_{OUT}$, is divided by an integer ratio 'N' in the way that:

$$F_{FD} = \frac{F_{OUT}}{N}$$

where N is an integer value.

When using an integer for the value of N, the resolution of the divider is inversely proportional to the frequency of an input clock if the output clock is fixed. For example, a higher resolution can be obtained by only using a higher frequency. At least for this reason, embodiments of the present invention use an integer divider combined with a phase selector to work as frequency divider 210. Using the phase selectable divider as frequency divider 210 in combination with PPSSCs 104, 106 as described below, the resolution can be improved by 2*K.

Referring back to FIG. 1A, PPSSCs 104, 106 are components that receive the phase signals from multiphase PLL 102 and output a reference clock to their corresponding PLLs 108, 110. PPSSCs 104, 106, which is further described below in FIGS. 3-9, generates control signals and provides precise phase timing for its corresponding PLLs 108, 110. PLLs 108, 110 are components that receive the reference clock from their corresponding PPSSCs 104, 106 and output a spread spectrum timing (SST) clock. PLLs 108, 110 can be the same or similar to PLL 200, described above in FIG. 2.

Figure 1B:
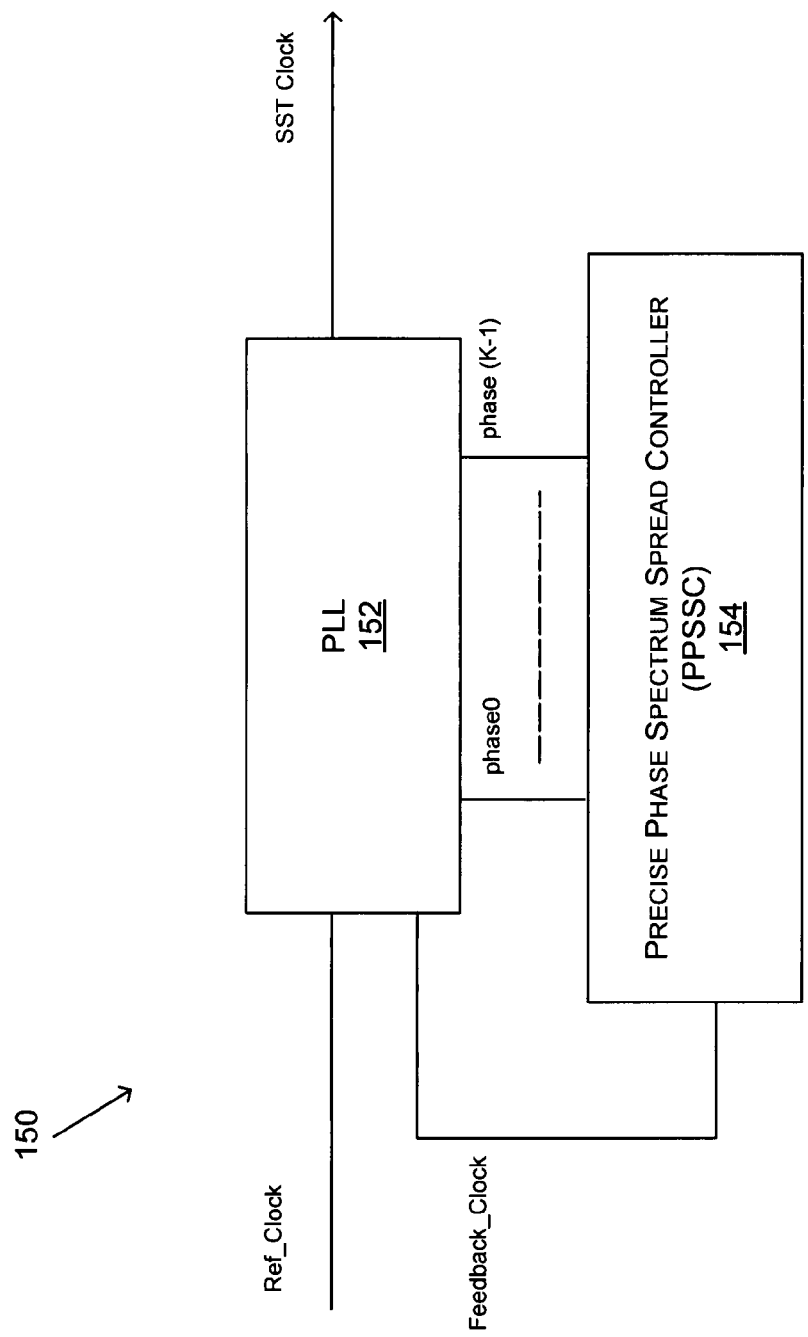

FIG. 1B illustrates a block diagram of an exemplary system including a digital spread spectrum timing circuit according to some embodiments of the invention. Exemplary system 150 provides spread-spectrum timing based on the feedback clock of PLL 152. Exemplary system 150 can include, among other things, a PLL 152 and a PPSSC 154.

PLL 152 is a component that receives a reference clock and provides PPSSC 154 with K number of phase signals (phase0 to phase(K−1)). For example, PLL 152 can be the same or similar to PLL 200, described above in FIG. 2. PPSSC 154 receives these phase signals and outputs a feedback clock back into PLL 152, which generates a SST clock. In this case, PPSSC 154 uses the phase information of the spreadable PLL 152 itself, so the source PLL in FIG. 1A is not required. Further, PPSSC 154 can be the same or similar to the PPSSCs provided above in FIG. 1A.

Figure 3:
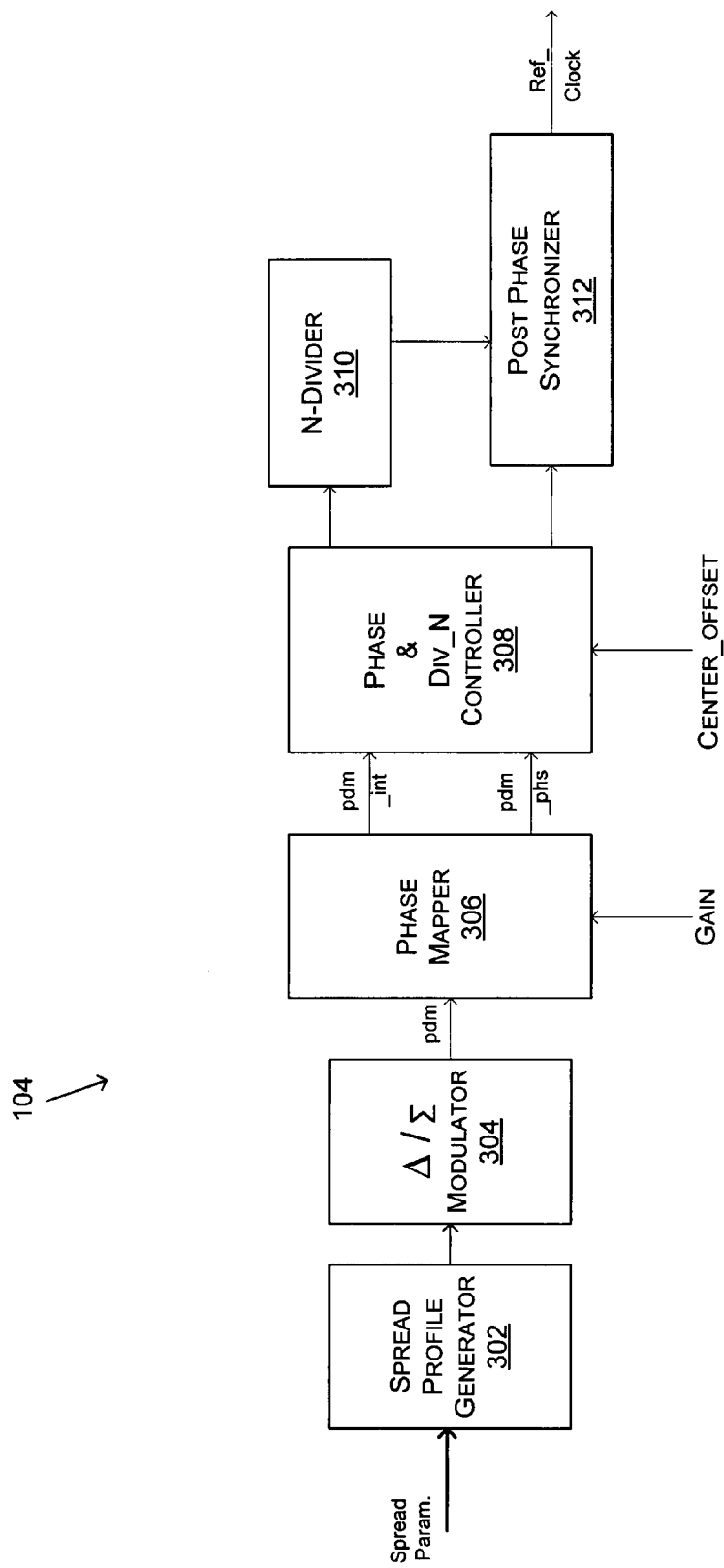
FIG. 3 illustrates an exemplary block diagram of the PPSSC of FIG. 1A & 1B according to some embodiments of the present invention.

FIG. 3 illustrates an exemplary block diagram of the PPSSC of FIGS. 1A & 1B according to some embodiments of the invention. PPSSC 104 can include, among other things, a spread profile generator 302, a Δ/Σ modulator 304, a phase mapper 306, a Phase & DIV_N controller 308, an N-divider 310, and a post phase synchronizer 312.

Figure 4:
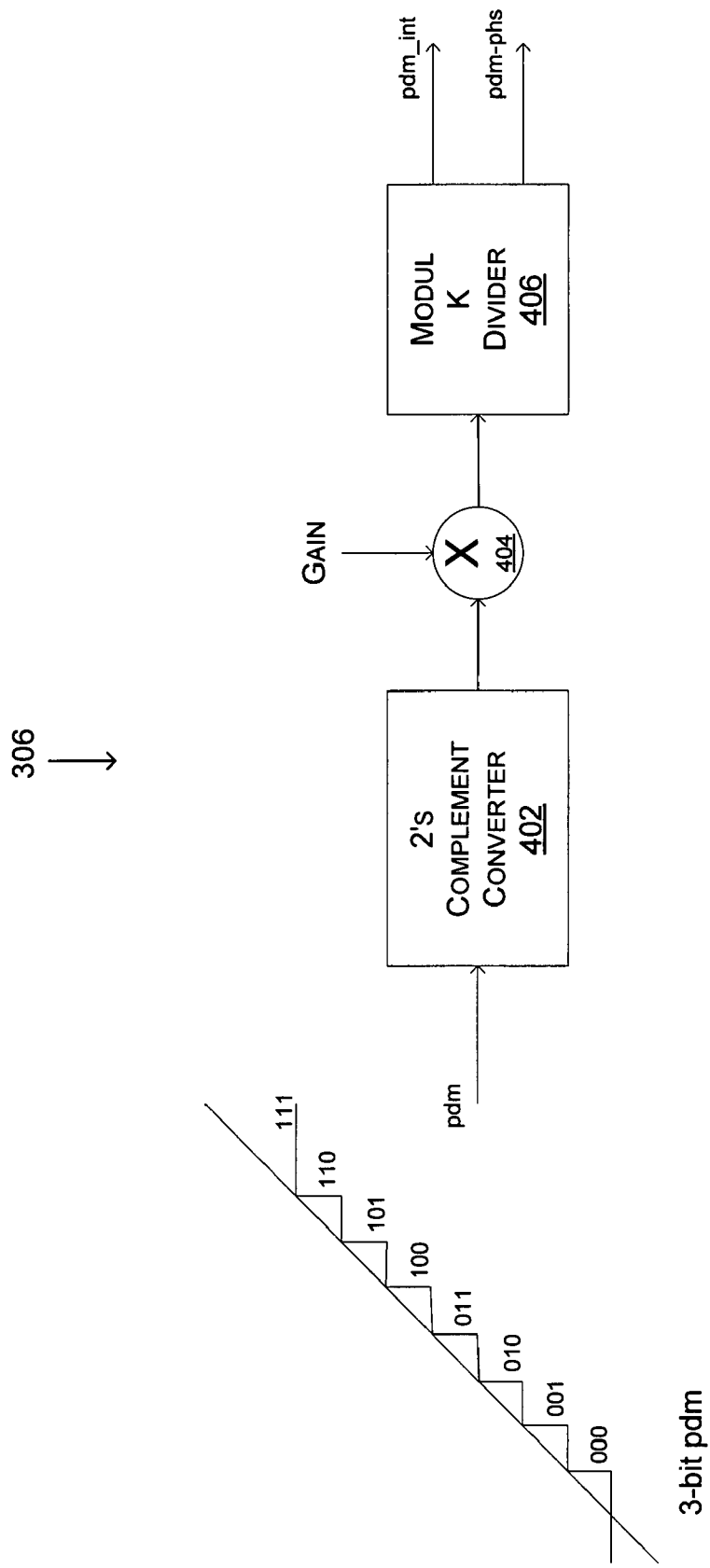
FIG. 4 illustrates an exemplary block diagram of the Phase Mapping of FIG. 3 according to some embodiments of the present invention.

Spread profile generator 302 is a component that receives the spread parameters for setting the dedicated spread depth and generates a multi-bit digital spread profile signal. Spread profile generator 302 provides the spread spectrum profile signal to Δ/Σ modulator 304. Δ/Σ modulator 304 is a component that receives the multi-bit spread spectrum profile signal and generates a Δ/Σ modulated (pdm) signal. For example, the pdm signal can be a 3-bit pdm signal, as illustrated in FIG. 4. Δ/Σ modulator 304 provides a quantized stepping signal according to the received digital spread profile signal. In some embodiments, a Δ/Σ algorithm can function as a fraction N-divider in timing statistical view where the Δ/Σ output signal can be added to a base number and used to control a frequency divider. For example, an N-divider can work at 1/(N+1) or 1/(N−1) depending on the Δ/Σ output, with the divider swinging between 1/(N+1) and 1/(N−1), a spread spectrum timing with designed amplitude is produced. When passing this timing signal to PLL's reference/feedback input, a clock with a spread spectrum is generated.

Phase mapper 306 is a component that receives the pdm signal from Δ/Σ modulator 302 and outputs a pdm integer signal (pdm_int) and a pdm phase signal (pdm_phs). Phase mapper 306 maps the quantization code of the pdm signal to phase timing data according to a gain setting. Phase mapper allows PPSSC 104 to operate using a minimum swing step of just one between differing values of the frequency divider of the PLL. FIG. 4 illustrates an exemplary embodiment of phase mapper 306. Phase mapper 306 can include, among other things, a complement converter 402, a multiplier 404, and a modul K divider 406.

Complement converter 402 can be a two's complement converter that converts the unsigned pdm signal to signed 2's complement data according to a reference value of the pdm signal. For example, if the pdm signal is a 3-bit signal, as illustrated in FIG. 4, the reference value could be a mid-level value such as 011 or 100. Complement converter 402 could generate an output value that equals the input value minus the reference value. For example, input value of 111 minus the reference value of 100 would provide an output value of 011 (+3), while an input of 000 would generate an output signal of 100 (−4). For the output signal in a 2's complement representation, the sign bit is the left most bit. A negative number occurs when the the left most bit is one. For example, output signal 100 would represent −4, while an output signal of 010 would represent a positive 2. At an integer view, the minimum quantization step of Δ/Σ modulator 304 can be mapped to a single step. Phase mapper 306 can map the minimum quantization step to a phase domain of the multi-phase clock and use the output of complement converter 402 as a control signal of timing generation. By doing so, the minimum timing resolution can be one phase of the source clock.

By having the ability to map to a single step, the resolution of the Δ/Σ modulator 304 can be doubled. For applications generating Δ/Σ based spread spectrum timing, the frequency divider of the PLL should swing between different values. For example, in prior known implementations, the minimum value swing is from N+1 to N−1. Thus, the minimum swing step is two for an integer application, two for a phase based application, and the center value would be ((N+1)+(N−1))/2=0. If the minimum swing is mapped from N to N+1 or N to N−1, as illustrated in the described embodiments of the invention, the minimum swing step can be just one for integer application or one phase for phased based application. The center value now can be changed to (N+(N+1))/2=0.5 or (N+(N−1))/2=−0.5. This minimum swing step of just one can be obtained by using the mapping method of phase mapper 306. For example, a one bit Δ/Σ output is either 0 or 1; when the output=0, then divider_n=N−1, when the output=1, then divider_n=N+1 when the center value is zero. If 0 is mapped to N−1 and 1 is mapped to N, the center value can be −0.5. To compensate for the center count value of 0.5 or −0.5, a center offset can be introduced to the PPSSC, wherein the center offset could be +½ or −½. For the PPSSC, it's possible to set the center offset by parameters so the offset introduced by the mapping method can be compensated without extra source cost.

Multiplier 404 receives the signed complement data from converter 402. When determined that the swing range is not sufficient for a spread amplitude, the minimum swing step can be enlarged to get a larger spread amplitude. Multiplier 404 can enlarge the swing step by multiplying the signed complement data with the introduced gain.

Modul K divider 406 receives the signal having a phase state from multiplier 404. Modul K divider 406 receives the signal, wherein the maximum available phase of the signal depends on the phase stage of source PLL. If the phase is larger than K, the modul K divider 406 converts the signal to an integer period (pdm_int) and a real phase format (pdm_phs). In some embodiments, to simplify the timing, only non-negative phases are used and modul K divider 406 converts the phase state to a negative integer period with a positive phase format. Modul K divider 406 provides the integer period and the phase format to controller 308.

In some embodiments, a mapping table can be used to implement all listed functions in phase mapper 306. The output signal of phase mapper 306 can include an integer part (pdm_int) and a phase part (pdm_phs) of the change value from the base N value.

Figure 5:
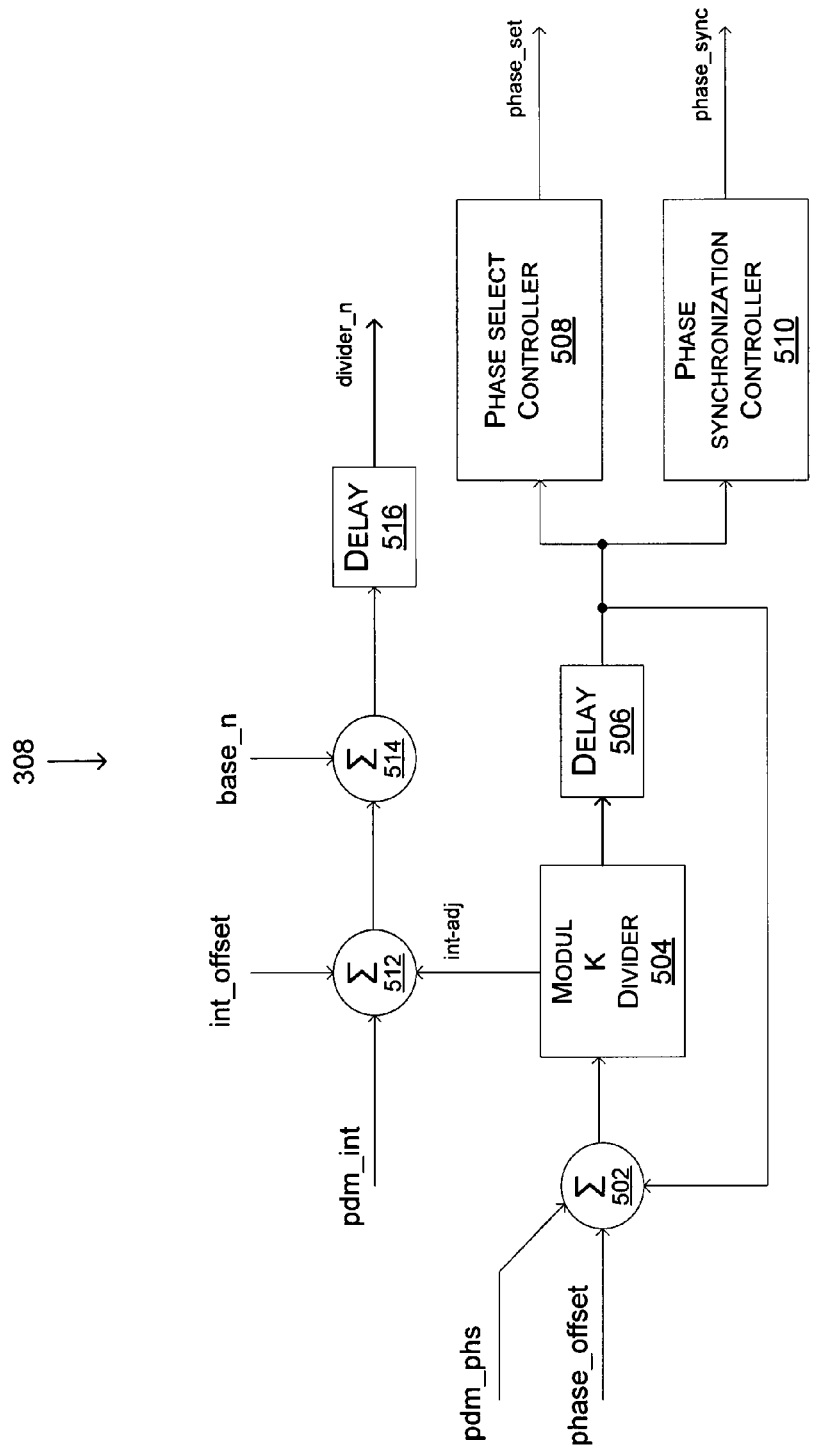
FIG. 5 illustrates an exemplary block diagram of the Phase & Div_N Controller of FIG. 3 according to some embodiments of the present invention.

Referring back to FIG. 3, phase & Div_N controller ("Controller") 308 receives the pdm_int and pdm_phs signals from phase mapper 306 and generates control signals (divider-n signal, phase_sel signal, and phase-sync signal) according to the received center-offset signal. The center offset signal can include an integer offset signal and phase offset, signal, both of which are described below. Further, Controller 308 generates control signals for the integer N-divider 3 10 and the post phase synchronizer 3 12. FIG. 5 illustrates an exemplary embodiment of Controller 308 of FIG. 3. Controller 308 includes, among other things, adders 502, 512, and 514, modul K divider 504, delays 506 and 516, phase select controller 508, and a phase synchronization controller 510.

Adder 502 receives the pdm_phs signal, the phase indicator offset signal (phase_offset of center_offset), and the signal provided by delay 506, adds these signals to form the next phase state, and outputs the next phase state to modul K divider 504. Modul K divider 504 receives the next phase state, wherein the maximum available phase depends on the phase stage of source PLL. If the phase is larger than K, modul K divider 504 converts the phase state to an integer adjust value (int_adj) and a real phase format. In some embodiments, to simplify the timing, only non-negative phases are used and modul K divider 504 converts the phase state to a negative integer period with a positive phase format. Modul K divider 504 provides the integer adjust value to adder 512 while providing the real phase format to delay 506.

Delay 506 acts as a data store cell by storing the current phase state. After storing the phase state, delay 506 provides the phase state to adder 502 for adding the phase state to a subsequent phase state signal and phase offset signal. Further, delay 506 provides the phase state to phase select controller 508 and phase synchronization controller 510. Phase select controller 508 maps the current phase state, stored in delay 506, to a phase select switch control signal (phase_sel) according to the requirements of post phase synchronizer 312, illustrated in FIG. 3. This phase select switch control signal can be a second level phase selection signal. Phase synchronization controller 510 generates a first order phase synchronize switch control signal (phase_sync) for post phase synchronizer 312, illustrated in FIG. 3.

Figure 7:
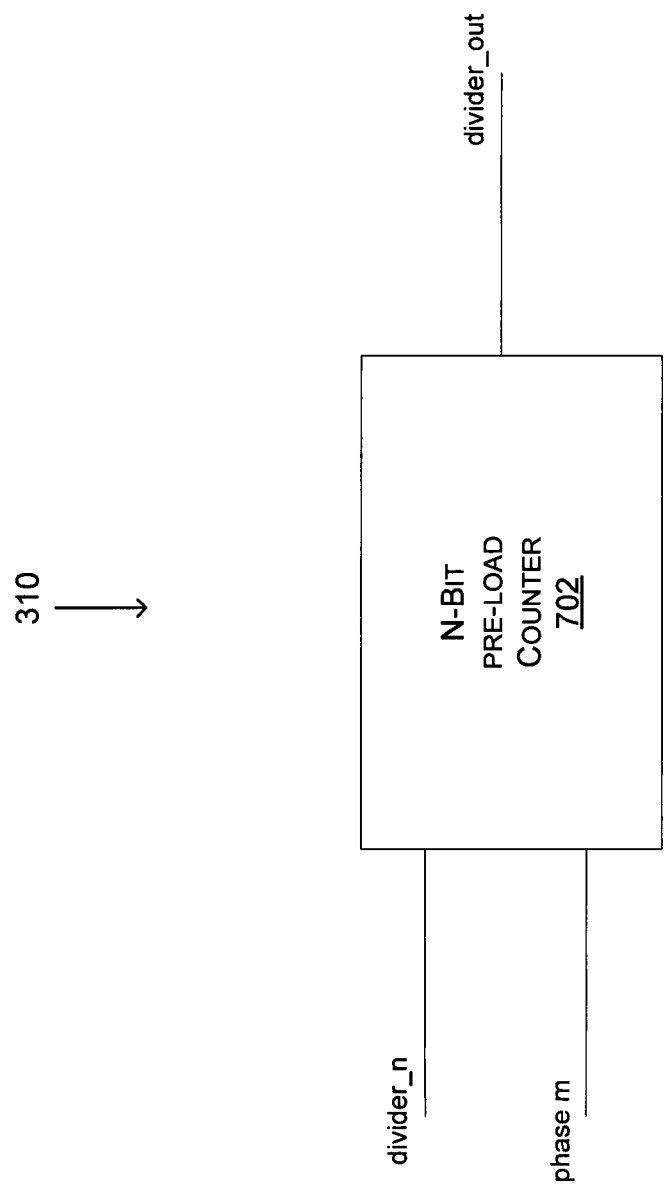
FIG. 7 illustrates an exemplary block diagram of the N-Divider of FIG. 3 according to some embodiments of the present invention.

Regarding the upper branch of Controller 308, adder 512 receives the pdm_int signal from phase mapper 306 and adds the pdm_int signal, the integer adjust signal (int_adj), and the integer offset signal (int_offset) of the center offset to generate an integer swing amplitude signal. The integer offset indicates the offset of the integer part of the counter value of N-divider 310. Adder 514 receives the base N value (base_n)

and the swing amplitude signal from adder 512 and adds these signals to generate an actual divider value for integer counter of FIG. 7. The base N value (base_n) is a non-spread mode divider_n value for FIG. 7. This divider value is provided to delay 516, which provides the delayed divider value to N-divider 310 of FIG. 3.

Figure 6:
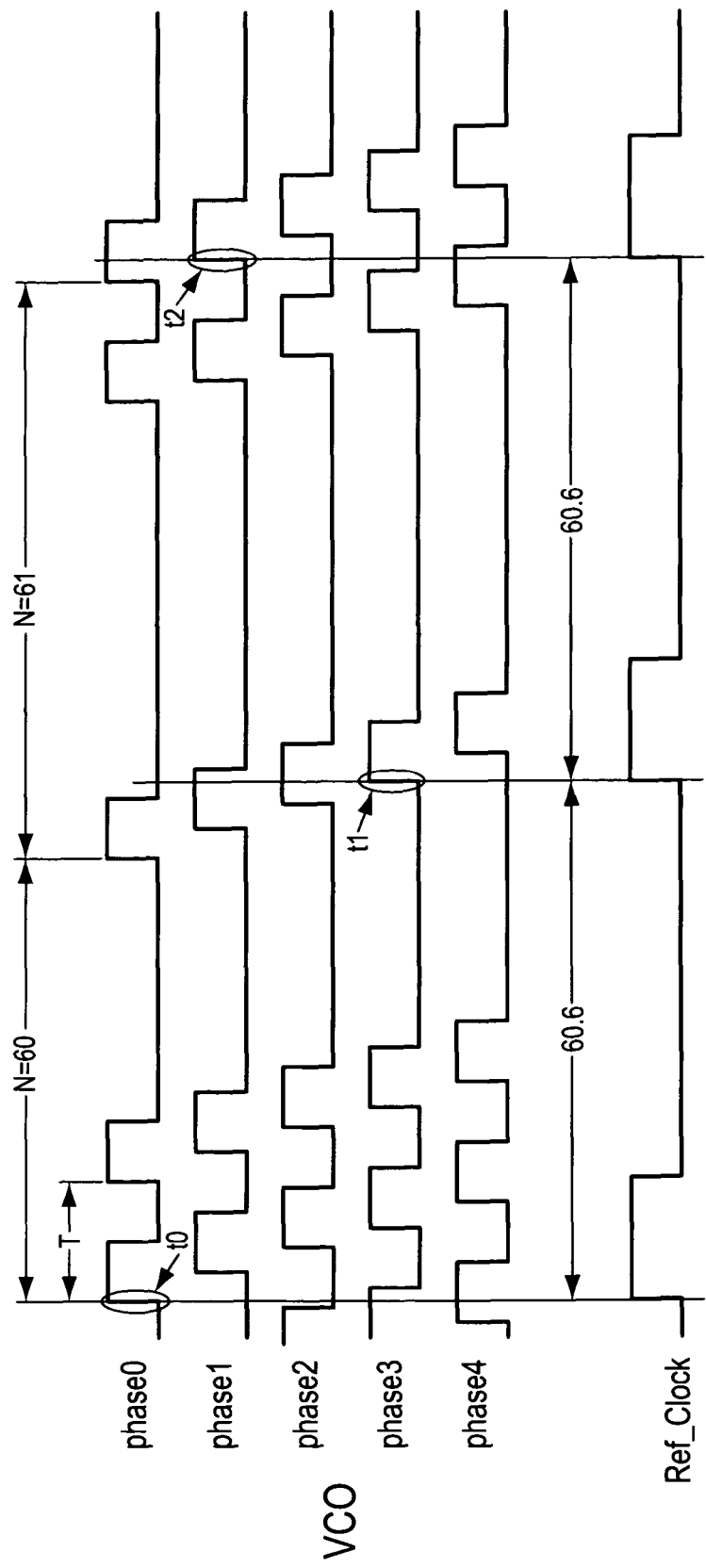
FIG. 6 represents an exemplary timing diagram of signals for the block diagram of FIG. 5 according to some embodiments of the present invention.

FIG. 6 represents an exemplary timing diagram of signals for the block diagram of FIG. 5 illustrating the integer adjust value (int_adj) according to a phase ahead or phase behind. For this exemplary diagram, phase0 to phase4 of VCO each provides a phase signal having a period of 60 T, wherein the high levels are separated by 0.2 T. If the high position starts at time 0, the high position of phase1 will start at time 0.2, phase2 will start at time 0.4, and so on.

In the diagram, if a period of 60.6 is preferred for a reference clock (ref_clock), the integer adjust value can be swung between 60 and 61 to modify the reference clock. For example, at start point t0, phase0 has a period of 60 T. So phase0, by itself, cannot provide the 60.6 period. The system uses the high position of phase3 at time t1, which occurs 0.6 T after the high position of phase0 at 60 T time. The reference clock relies on the high position of phase3 at time1 for reference clock. The integer adjust value swings to 61 (N=60+1) for the following reference clock cycle from the high position of phase0 at time 60 T because 60 T+60 T would not reach the time for the next reference clock cycle at 121.2 T. At time 121 T (60 T+61 T), the high position of phase0 occurs. This high position does not match the period of 60.6, which would occur at 121.2 T. So the system uses the high position of phase1 at t2 to trigger the reference clock cycle.

Referring back to FIG. 3, N-divider 310 receives the divider_n signal from Controller 308 and generates a divider output signal. N-divider 310 divides the input frequency by the divider_n value. FIG. 7 illustrates an exemplary embodiment of N-divider 310 of FIG. 3. N-divider 310 can include, among other things, an N-bit pre-load counter 702. N-bit pre-load counter 702 receives a selected clock phase signal (phase_m) and the divider_n signal and generates a corresponding divider output signal (divider_out) by dividing the phase_m signal with the divider_n value. In some embodiments, the divider output signal can be synchronized by the same clock that isolates the delay of N-divider 310 in post phase synchronizer 312.

Figure 8:
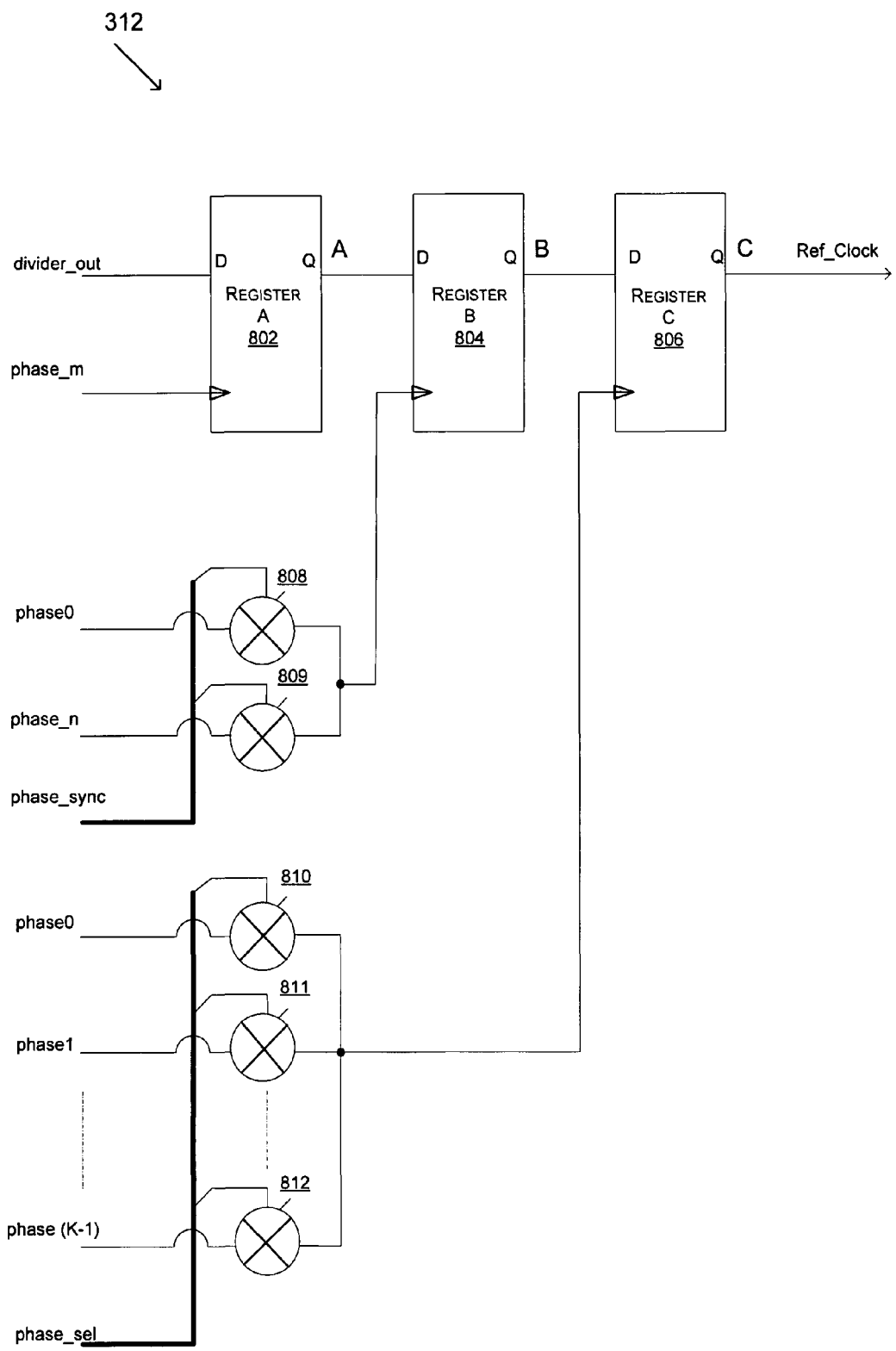
FIG. 8 illustrates an exemplary block diagram of the Post Phase Synchronizer of FIG. 3 according to some embodiments of the present invention.

Referring back to FIG. 3, post phase synchronizer 312 receives the phase control signals from Controller 308 and the divider output signal (divider_out) from N-divider 310 and provides a reference clock (Ref_Clock). FIG. 8 illustrates an exemplary embodiment of post phase synchronizer 312 of FIG. 3. Post phase synchronizer 312 can include, among other things, a register A 802, a register B 804, a register C 806, and a plurality of switches 808-812.

Register A 802 receives the divider output signal (divider_out) and the same phase_m clock signal for synchronizing the divider output signal to isolate the delay of the N-divider 310. The phase_m clock signal can be any phase of the source PLL. In some embodiments, register A 802 can be removed if no designed timing issue for Register B. Register A 802 outputs signal A according to divider output signal and the phase_m signal.

Register B 804 receives the output signal (signal A) of register A 802 and outputs signal B according to the incoming clock signal. The incoming clock signal is based on phase synchronize switch signal (phase_sync), provided by Controller 308. This phase synchronize switch signal is applied to switches 808 and 809, which correspond to phase0 and phase_n, respectively. The output of these switches act as the first level phase synchronize clock for register B.

Register C 806 receives the output signal (signal B) of register B 804 and provides a reference clock signal (Ref_Clock) to a PLL (e.g., PLL 108, 110, or 152) according to the incoming clock signal. The incoming clock signal is based on the phase select switch signal (phase_sel), provided by Controller 308. The phase select switch signal is applied to switches 810-812, which correspond to phase0, phase1, and phase(K−1), respectively. The output of these switches act as the second level phase select clock for register C 806.

This two stage synchronization allows the PPSSC to resolve any timing issues for synchronizing the PLL divider's output to any phase. Without the first stage synchronization, the maximum path delay allowed by design is T/K, where T is the period of the clock from the source PLL and K is the total number of phase levels of the source PLL. Using this two-stage synchronization technology, the maximum path delay can be (K−2)T/K.

Figure 9:
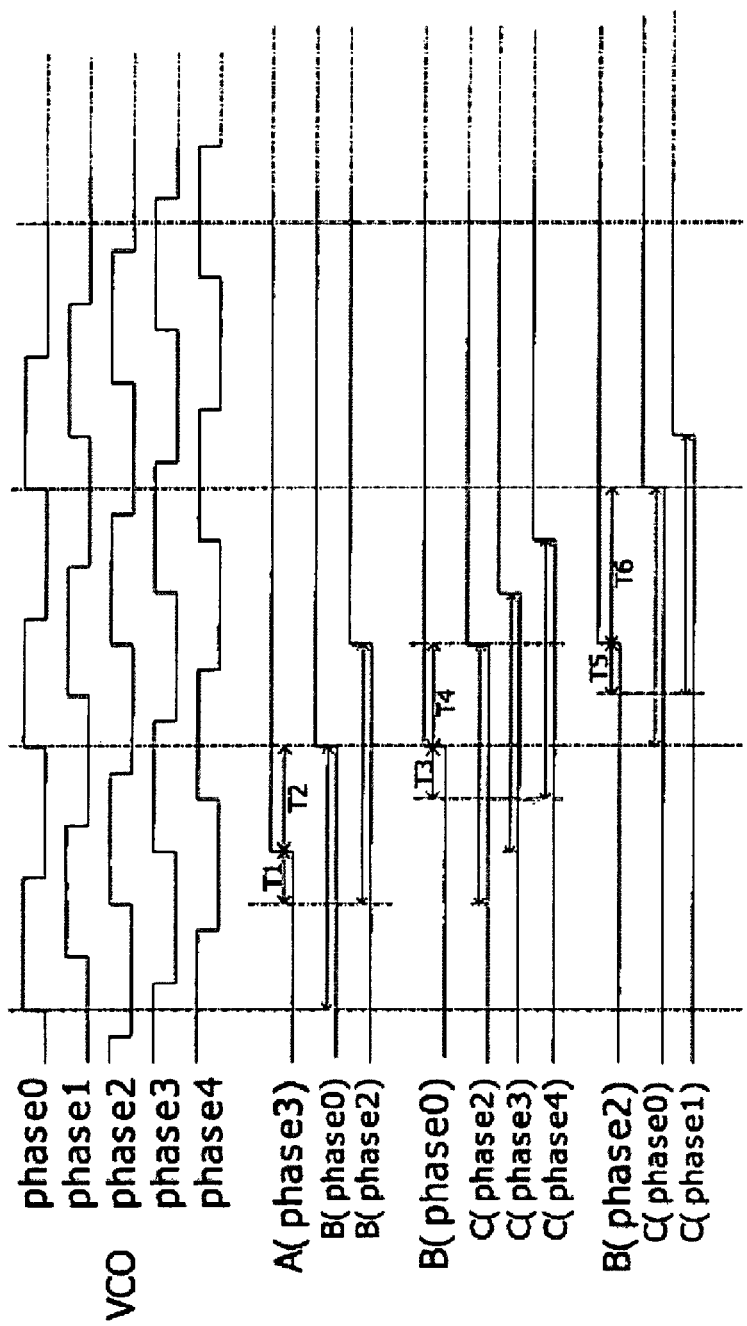
FIG. 9 represents a timing diagram of signals for the block diagram of FIG. 8 according to some embodiments of the present invention.

FIG. 9 represents a timing diagram of phase synchronization for the block diagram of FIG. 8 according to some embodiments of the invention. In this exemplary timing diagram, signals A, B, and C are marked along with 5 levels of a source PLL clock. For example, PLL's phase3 signal can be selected as the phase_m signal of FIGS. 7 & 8, which acts as an integer counter and its output clock synchronize signal for register A 802. Phase0 and phase2 (phase_n signal of FIG. 8) are selected as the first synchronize stage clock for register B 864. For example, regarding point A, the maximum timing gap is T1+T2=(3*T)/5. For point B(phase0), the maximum timing gap is T3+T4=(3*T)/5; while for point B(phase2), it's T5+T6=(4*T)/5. The maximum timing gap for point B is a minimum of one for B(phase0) and B(phase2). The maximum timing gap for the circuit of FIG. 8 would be a minimum of one between point A and point B, which is (3*T)/5. During the synchronization, delay is introduced from input timing (divider_out) to output timing(Ref_clock). Because this delay is applied to all clock phases, PPSSC can eliminate this delay by simply rearranging the phase rotate relationship. For example, in this 5-phases application, we can just use phase2 as the start phase of a PLL clock period instead of using phase0.

Figure 10:
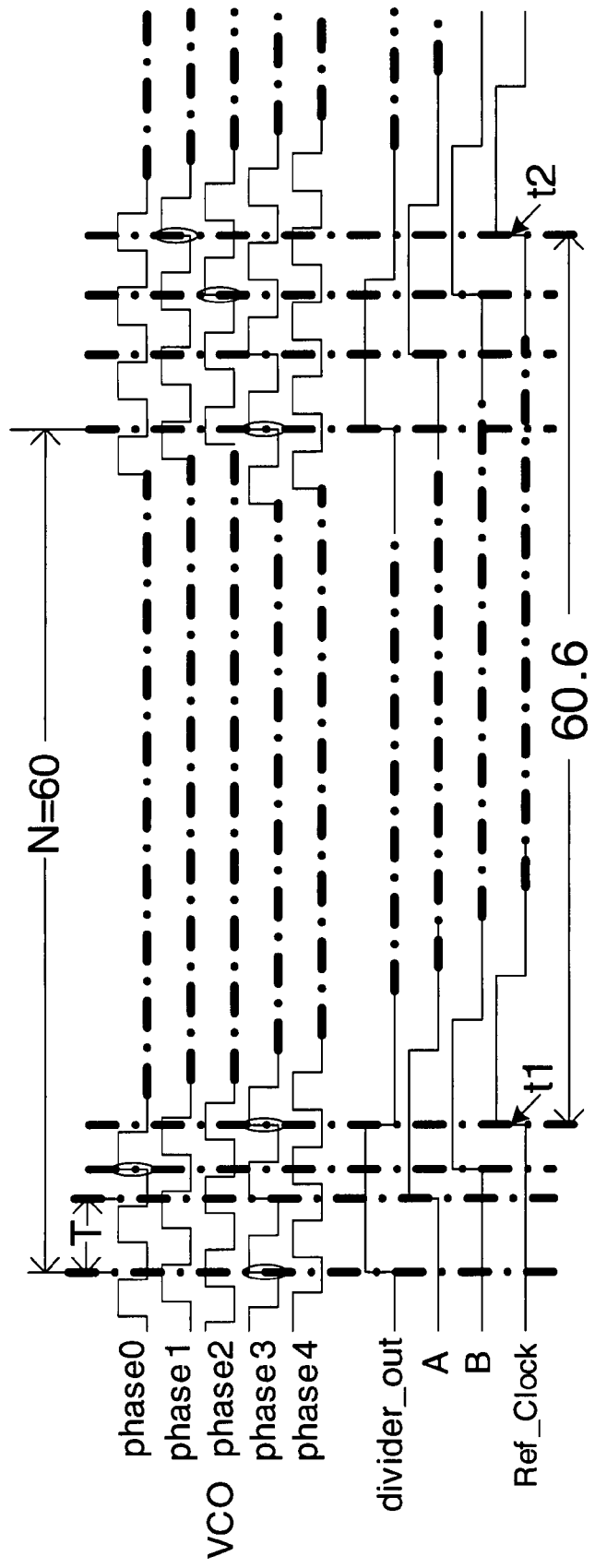
FIG. 10 illustrates an exemplary timing diagram of a precise phase divider according to some embodiment of the present invention.

FIG. 10 illustrates an exemplary timing diagram of a precise phase divider according to some embodiment of the present invention. In this exemplary timing diagram, phase3 is selected as phase_m of FIG. 8 while phase2 is selected as phase-n of FIG. 8. This exemplary timing diagram illustrates a system using a 5 phase output PLL, where phase0 to phase4 are the outputs of multi-phase PLL, and where divider_out is the output of N-bit pre-load counter 702 of FIG. 7. Signal A is an output signal of register A 802 of FIG. 8 according to the divider_out signal and the PLL phase3 clock. Signal B is a first stage synchronized output of register B 804 of FIG. 8, while Ref_Clock is second stage synchronized output of register C 806 of FIG. 8.

To obtain a divide output of 60.6, if current output phase is phase3 (t1 in FIG. 10) then the next output phase to get a 60.6 divide would be phase1 (phase3->phase4->phase0->phase1) (t2 in FIG. 10). Delay 516 of FIG. 5 can provide a divider_n value of 60. N-bit pre-load counter of FIG. 7 can work with this value and generate the divider_out signal of FIG. 10. At time t1, a phase3 output is needed so phase synchronization controller 510 of FIG. 5 can select phase0 as the first stage synchronous output clock, and phase select controller 508 of FIG. 5 can provide a select signal to select phase3 as the clock for the second stage. At time t2, a phase1 output is needed to obtain the 60.6 divide output so phase synchronization controller 510 of FIG. 5 can select phase2 as the first stage synchronous output, while phase select controller 508 of FIG. 5 can provide a select signal to select phase 1 as the clock for the second stage.

Figure 11:
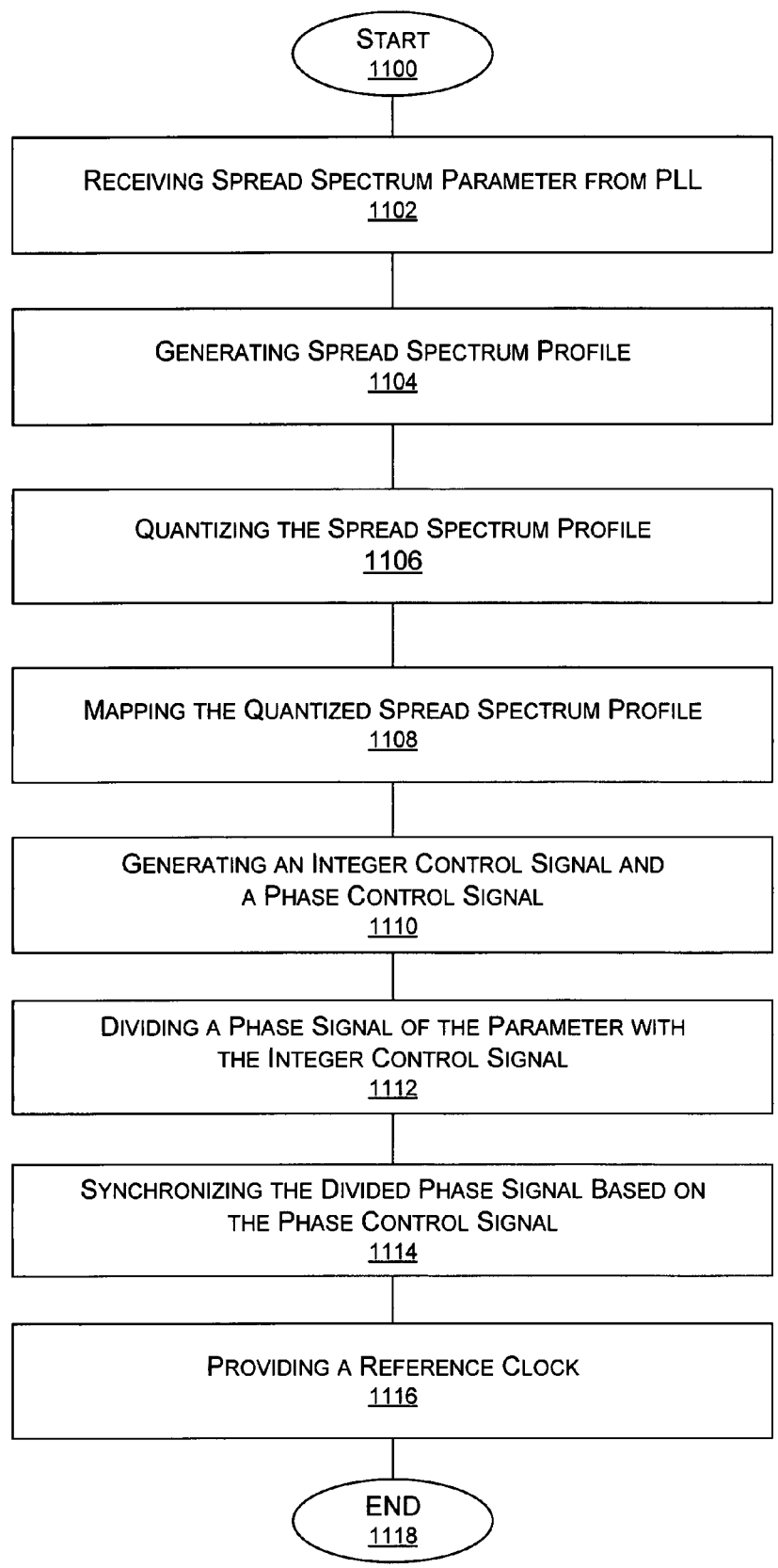
FIG. 11 represents an exemplary method for providing a reference clock for a PLL in an SSCG.

FIG. 11 represents an exemplary method for providing a reference clock for a PLL in an SSCG. It will be readily appreciated by one of ordinary skill in the art that the illustrated procedure can be altered to delete steps, move steps, or further include additional steps. After initial start step 1100, PPSSC receives a spread spectrum parameter from PLL at step 1102. This spread spectrum parameter can include K levels of phase signals generated by a VCO of the PLL.

After receiving the spread spectrum parameter, the PPSSC can generate a spread spectrum profile at step 1104. The PPSSC can then quantize the spread spectrum profile at step 1106. For example, quantization step 1106 can be executed by a Δ/Σ modulator, such as Δ/Σ modulator 304 of FIG. 3. After quantizing the profile, PPSSC can map the quantized spread spectrum profile at step 1108. Mapping step 1108 can comprise converting the unsigned quantized profile to a signed quantized profile using a converter, e.g., a 2's complement converter. Mapping step 1108 can further include deriving an integer period signal and a phase format signal from the signed quantized profile based on a determination whether the signed quantized signal is larger than the number of levels of the multiple level parameter. This deriving portion could be executed by a modul K divider, such as modul K divider 406 of FIG. 4.

After mapping step 1108, the PPSSC can generate an integer control signal and a phase control signal at step 1110. For example, the integer control signal could be the divider_n signal described above, while the phase control signal can include the phase_sel signal and/or the phase_sync signal. The integer and phase control signals are generated by swinging the integer value and/or the phase value based on the mapped profile at mapping step 1108. An exemplary circuit for providing generating step 1110 is illustrated in FIG. 5.

PPSSC then divides a phase signal of the K-level spread parameter with the integer control signal at step 1112. For example, the output of dividing step could be the divider_out signal described above. Next, at step 1114, PPSSC synchronizes the divided phase signal. Synchronizing step 1114 could be performed by a two-stage synchronization circuit (e.g., the post phase synchronizer of FIG. 8). Synchronizing step 1114 uses the phase control signal from generating step 1110 to delay the divided phase signal. By delaying the divided phase signal, the PPSSC can provide a reference clock for generating spread spectrum timing at step 1116. After providing step 1116, the method may end at step 1118.

The methods disclosed herein may be implemented as a computer program product, i.e., a computer program tangibly embodied in an information carrier, e.g., in a machine readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand alone program or as a module, component, subroutine, or other unit suitable for use in a computing environment. A computer program can be deployed to be executed on one computer or on multiple computers at one site or distributed across multiple sites and interconnected by a communication network.

In the preceding specification, the invention has been described with reference to specific exemplary embodiments. It will however, be evident that various modifications and changes may be made without departing from the broader spirit and scope of the invention as set forth in the claims that follow. The specification and drawings are accordingly to be regarded as illustrative rather than restrictive sense. Other embodiments of the invention may be apparent to those skilled in the art from consideration of the specification and practice of the invention disclosed herein.

What is claimed is:

1. A method comprising:
    receiving a spread spectrum parameter from a phase lock loop, wherein the spread spectrum parameter includes a multiple-level parameter comprising a plurality of phase signals;
    quantizing a spread spectrum profile associated with the spread spectrum parameter;
    mapping the quantized profile;
    generating control signals based on the mapping, wherein the control signals include an integer control signal and a phase control signal;
    dividing a phase signal of the plurality of phase signals with the integer control signal;
    synchronizing the divided phase signal using the phase control signal; and
    providing a reference clock for a spread spectrum clock generator based on the synchronizing.

2. The method of claim 1, wherein synchronizing involves using a two stage synchronization circuit that receives the phase control signal and provides the reference clock based on the phase control signal and the divided phase signal.

3. The method of claim 2, wherein generating the phase control signal includes generating a phase synchronization signal for selecting a phase signal of the plurality of phase signals to be a clock for the first stage of the synchronization circuit.

4. The method of claim 2, wherein generating the phase control signal includes generating a phase select signal for selecting a phase signal of the plurality of phase signals to be a clock for the second stage of the synchronization circuit.

5. The method of claim 1, wherein mapping the quantized profile comprises:
    converting the quantized signal of the quantized spread spectrum profile into a signed quantized signal;
    determining whether the signed quantized signal is larger than the number of levels of the multiple level parameter; and
    converting the signed quantized signal to an integer period signal and a phase format signal based on the determination.

6. A system comprising:
    a phase locked loop providing a spread spectrum parameter including a multiple-level parameter comprising a plurality of phase signals; and
    a phase spread spectrum controller that receives the spread spectrum parameter, the phase spread spectrum controller comprising:
        a phase mapper configured to map a quantized spread spectrum profile associated with the spread spectrum parameter,
        a phase controller configured to generate control signals based on the map profile, wherein the control signals include an integer control signal and a phase control signal,
        an integer divider configured to divide a phase signal of the plurality of phase signals with the integer control signal, and a phase synchronizer configured to synchronize the divided phase signal using the phase control signal to generate a reference clock for a spread spectrum clock generator.

7. The system of claim 6, wherein the phase synchronizer includes a synchronization circuit including a first register and a second register.

8. The system of claim 7, wherein the phase controller generates the phase control signal including a phase synchronization signal for selecting a phase signal of the plurality of phase signals to be clocked into the first register of the synchronization circuit.

9. The system of claim 7, wherein the phase controller generates the phase control signal including a phase select signal for selecting a phase signal of the plurality of phase signals to be clocked into the second register of the synchronization circuit.

10. The system of claim 6, wherein the phase mapper comprises:
   a two's complement converter configured to convert the quantized signal of the quantized spread spectrum profile into a signed quantized signal; and
   a modul divider configured to determine whether the signed quantized signal is larger than the number of levels of the multiple level parameter and to convert the signed quantized signal to an integer period signal and a phase format signal based on the determination.

11. The system of claim 6, wherein the phase spread spectrum controller further comprises:
   a spread profile generator configured to receive the spread spectrum parameter from the phase locked loop and generate a spread spectrum profile; and
   a Δ/Σ modulator for creating the quantized spread spectrum profile based on the spread spectrum profile.

12. An apparatus comprising:
   a phase mapper configured to map a quantized spread spectrum profile associated with a spread spectrum parameter from a phase locked loop, wherein the spread spectrum parameter includes a multiple-level parameter comprising a plurality of phase signals;
   a phase controller configured to generate control signals based on the map profile, wherein the control signals include an integer control signal and a control signal;
   an integer divider configured to divide a phase signal of the plurality of phase signals with the integer control signal; and
   a phase synchronizer configured to synchronize the divided phase signal using the phase control signal to generate a reference clock for a spread spectrum clock generator.

13. The apparatus of claim 12, wherein the phase synchronizer includes a synchronization circuit comprising a first register and a second register.

14. The apparatus of claim 13, wherein the phase controller generates the phase control signal including a phase synchronization signal for selecting a phase signal of the plurality of phase signals to be clocked into the first register of the synchronization circuit.

15. The apparatus of claim 13, wherein the phase controller generates the phase control signal including a phase select signal for selecting a phase signal of the plurality of phase signals to be clocked into the second register of the synchronization circuit.

16. The apparatus of claim 12, wherein the phase mapper comprises:
   a two's complement converter configured to convert the quantized signal of the quantized spread spectrum profile into a signed quantized signal; and
   a modul divider configured to determine whether the signed quantized signal is larger than the number of levels of the multiple-level parameter and to convert the signed quantized signal to an integer period signal and a phase format signal based on the determination.

17. The apparatus of claim 12, further comprising:
   a spread profile generator configured to receive the spread spectrum parameter from the phase locked loop and generate a spread spectrum profile; and
   a Δ/Σ modulator for creating the quantized spread spectrum profile based on the spread spectrum profile.

* * * * *